(12) United States Patent
Cui et al.

(10) Patent No.: US 8,067,944 B2
(45) Date of Patent: Nov. 29, 2011

(54) USB COMPONENT TESTER

(75) Inventors: Zhen-Shan Cui, Shenzhen (CN); Lian-Zhong Gong, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 536 days.

(21) Appl. No.: 12/340,752

(22) Filed: Dec. 22, 2008

(65) Prior Publication Data
US 2010/0141266 A1 Jun. 10, 2010

(30) Foreign Application Priority Data
Dec. 4, 2008 (CN) .......................... 2008 1 0305965

(51) Int. Cl.
*G01R 31/04* (2006.01)
(52) U.S. Cl. ....................................................... 324/538
(58) Field of Classification Search .................. None
See application file for complete search history.

(56) References Cited

U.S. PATENT DOCUMENTS

| | | | | |
|---|---|---|---|---|
| 3,217,244 A | * | 11/1965 | Glover | 324/540 |
| 3,818,329 A | * | 6/1974 | Reaves, Jr. | 324/540 |
| 4,326,162 A | * | 4/1982 | Hankey | 324/542 |
| 6,701,401 B1 | * | 3/2004 | Lu et al. | 710/305 |
| D518,393 S | * | 4/2006 | Nesenoff | D10/75 |

* cited by examiner

*Primary Examiner* — Paresh Patel
(74) *Attorney, Agent, or Firm* — Altis Law Group, Inc.

(57) ABSTRACT

A universal serial bus (USB) component tester for testing a USB component that has a plug and a USB port includes a connector, a USB port, and a first indicator. The connector includes a first power pin, a first data pin connected to the first power pin, a second data pin, and a first ground pin connected to the second data pin and also connected to the first data pin via a first resistor. The USB port includes a power terminal connected to a power supply, a first data terminal, a second data terminal, and a grounded ground terminal, and the first data terminal is connected to the second data terminal via a second resistor. The first indicator includes a first terminal connected to the first data terminal via the second resistor, and a second terminal connected to the second data terminal.

13 Claims, 5 Drawing Sheets

USB COMPONENT TESTER

BACKGROUND

1. Technical Field

The present disclosure relates to testers and, particularly, to a universal serial bus (USB) component tester.

2. Description of Related Art

Today, USB components are broadly applied in serial communication solutions and become more and more important. A USB component generally includes USB ports and plugs. After manufacturing, the USB component needs to be tested. A general method for testing USB components uses some ordinary USB devices such as USB pointing devices, USB keyboards, USB hard disk drives, and/or a motherboard etc., to directly connect to the USB ports, and the plugs, and check if the USB ports and plugs work or not. However, this method requires plugging or unplugging the USB devices and/or the motherboard to or from the USB ports separately and frequently, which is unduly laborious and time-consuming. In addition, because this method utilizes USB pointing devices, keyboards, hard disk drives, etc. and the motherboard, it is costly.

What is needed, therefore, is to provide a USB component tester to overcome the above described shortcomings.

DETAILED DESCRIPTION

Figure 1:
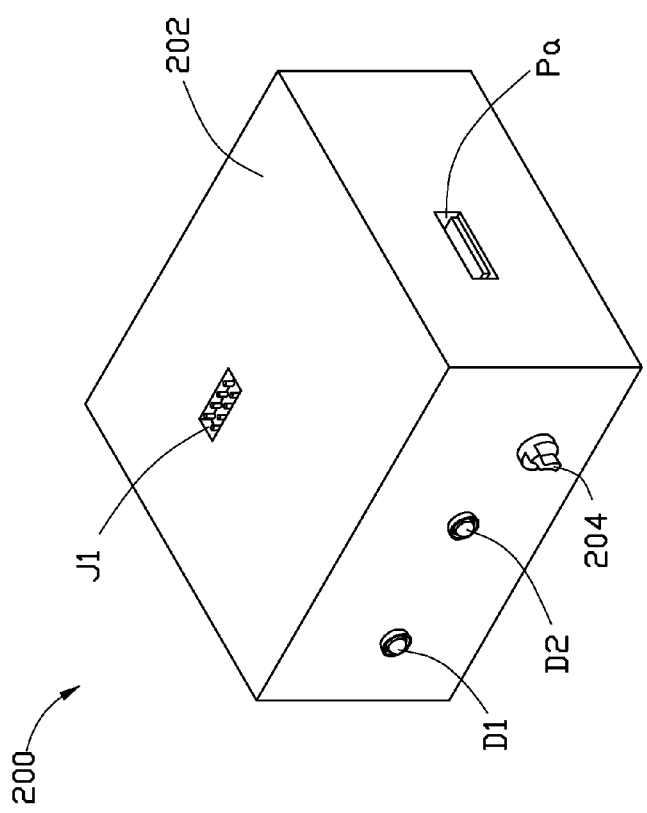
FIG. 1 is an isometric, schematic view of an exemplary embodiment of a USB component tester.
Figure 2:
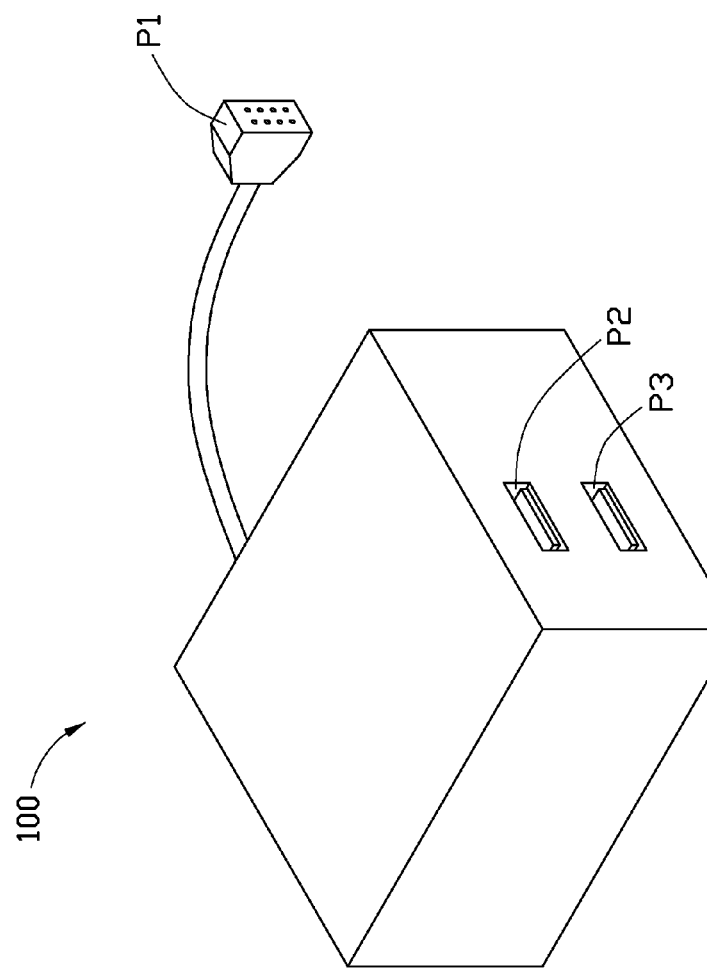
FIG. 2 is an isometric, schematic view of an exemplary USB component to be tested.

Referring to FIGS. 1 and 2, an exemplary embodiment of a USB component tester 200 includes a case 202, and a power switch 204, a USB port Pa, a connector J1 including eight pins configured for connecting to a plug P1 of a USB component 100 to be tested of FIG. 2, and two light emitting diodes (LEDs) D1 and D2, all installed on the case 202. The USB port Pa is configured for communicating with USB port P2 or P3 of the USB component 100 via a USB line. The LED D1 is configured for indicating whether the USB component 100 is in a normal work state, the LED D2 is configured for indicating whether the USB component tester 200 is powered on.

In one embodiment, the LEDs D1 and D2 may be replaced by other types of indicators, such as buzzers, and so on.

Figure 2A:
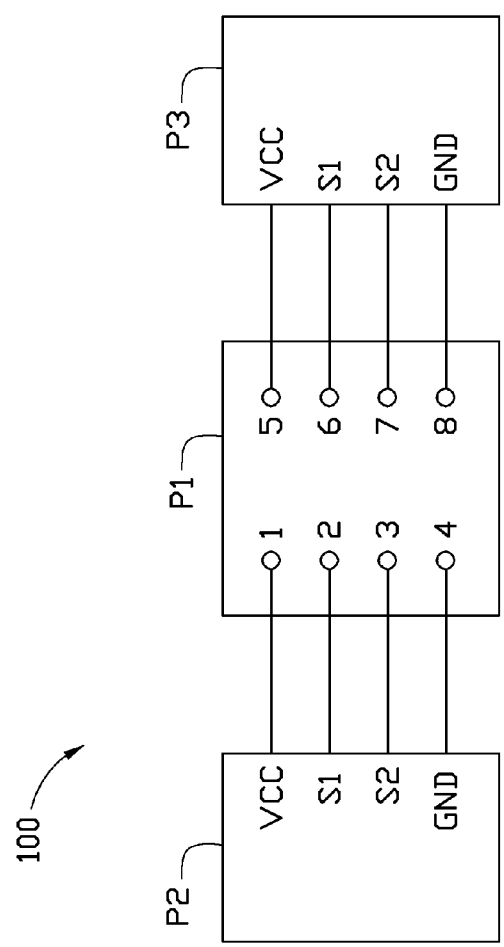
FIG. 2A is a schematic diagram of the connections between a plug and two USB ports of the USB component of FIG. 2.

Referring to the FIG. 2A, the plug P1 of the USB component 100 defines two rows of holes. A row of holes including four holes 1-4 are connected to a power terminal VCC, a first data terminal S1, a second data terminal S2, and a ground terminal GND of the USB port P2, and the other row of holes including four holes 5-8 are connected to a power terminal VCC, a first data terminal S1, a second data terminal S2, and a ground terminal GND of the USB port P3. The plug P1 can be installed on a motherboard, and the USB ports P2 and P3 can serve as rear USB ports or front USB ports.

Figure 3:
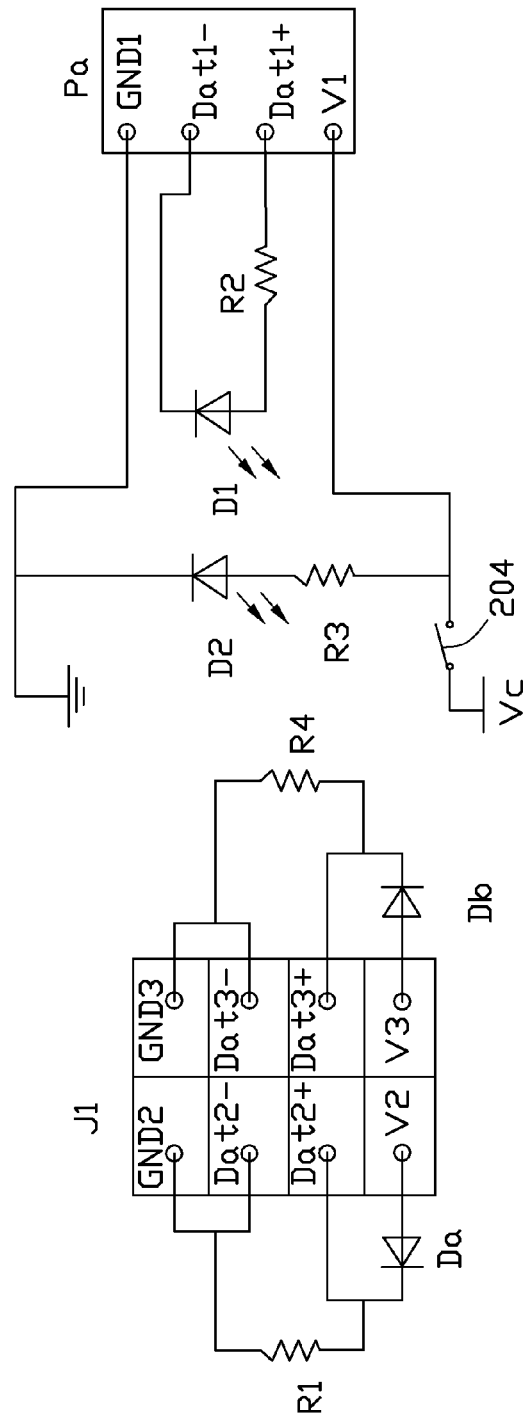
FIG. 3 is a circuit diagram of the USB component tester of FIG. 1, according to an exemplary embodiment.

Referring to FIG. 3, the USB component tester 200 further includes four resistors R1-R4, and two diodes Da and Db installed in the case 202. A power terminal V1 of the USB port Pa is connected to a power supply Vc via the power switch 204. In one embodiment, the power supply Vc is at least one battery installed in the case 202, in other embodiments, the power supply Vc may be an external power supply. The power terminal V1 of the USB port Pa is also connected to an anode of the LED D2 via the resistor R3, a cathode of the LED D2 is grounded. A data terminal Dat1+ of the USB port Pa is connected to an anode of the LED D1 via the resistor R2, a cathode of the LED D1 is connected to the data terminal Dat1− of the USB port Pa, a ground terminal GND1 of the USB port Pa is grounded. A power pin V2 of the connector J1 is connected to an anode of the diode Da. A cathode of the diode Da is connected to a data pin Dat2+ of the connector J1, and is also connected to a data pin Dat2− and a ground pin GND2 of the connector J1, via the resistor R1. A power pin V3 of the connector J1 is connected to an anode of the diode Db. A cathode of the diode Db is connected to a data pin Dat3+ of the connector J1, and is also connected to a data pin Dat3− and a ground pin GND3 of the connector J1, via the resistor R4.

In case some capacitors of an internal circuit of the USB component 100 are in a charged state, and when the plug P1 of the USB component 100 is engaged with the connector J1, the capacitors discharge via the resistors R1 and R4 to prevent errors that could be caused by the charged capacitors. The diodes Da and Db are configured for preventing the plug P1 of the USB component 100 from engaging with the connector J1 the wrong way.

In one embodiment, the resistors R1 and R4 are about 2000 ohm resistors, and the resistors R2 and R3 are about 200 ohm resistors. The power supply Vc is about 5V direct current power supply. In other embodiments, the number of the USB port Pa is not limited to one, and the connector J1 is not limited to eight pins, that is, the number and the structure of the USB port Pa and the connector J1 can be adjusted according to different structures of the plug P1 of the USB component 100.

Figure 4:
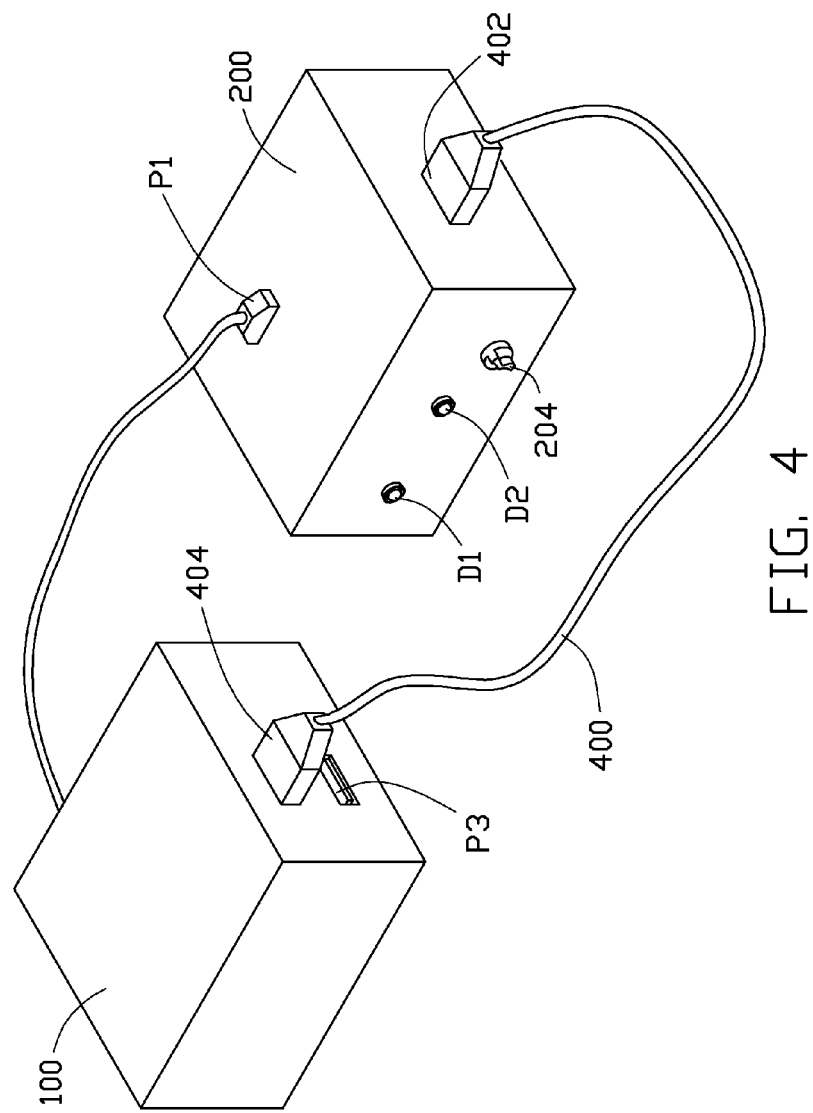
FIG. 4 is an isometric view of the USB component tester of FIG. 1 being used to test the USB component of FIG. 2.

Referring to FIG. 4, in use, the plug P1 of the USB component 100 engages with the connector J1, that is, the power pins V2 and V3 of the connector J1, the data pins Dat2+, Dat3+, Dat2−, Dat3−, and the ground pins GND2 end GND3 are connected to the USB ports P2 and P3 respectively. A USB plug 402 of an authenticated USB line 400 is connected to the USB port Pa, and a USB plug 404 of the USB line 400 is connected to the USB port P2 or P3. Take the USB plug 404 of the USB line 400 connected to the USB port P2 for example, that is, the power pin V2, the data pins Dat2+ and Dat2−, the ground pin GND2 of the connector J1 are connected to the USB port P2 via the USB line 400 and the USB port Pa. The power switch 204 is turned on, the LED D2 emits light, indicating that the USB component tester 200 is powered up.

When the USB component 100 works normally, the power supply Vc provides current flowing through the power terminal V1 of the USB port Pa, the power pin V2 of the connector J1, the data pin Dat2+ of the connector J1, the data terminal Dat1+ of the USB port Pa, the resistor R2, the LED D1, the data terminal Dat1− of the USB port Pa, the data pin Dat2− of the connector J1, the ground pin GND2 of the connector J1, the ground terminal GND 1 of the USB port Pa to the ground. In this process, there is current flowing through the LED D1 to make the LED D1 emit light, indicating that the USB component 100 is in a normal work state.

When the USB component 100 does not work, there is no current flow, and the LED D1 does not emit light.

The test principle for testing the USB component 100, by connecting the USB plug 404 to the USB P3, is the same as by the USB plug 402 connecting to the USB port P2.

In other embodiments, the diode Da, the resistor R3, and the diode D2 can be omitted in order to reduce costs. In addition, if the USB component 100 includes only one USB port P2, the resistor R4 and the diode Db can be omitted.

It is to be understood, however, that even though numerous characteristics and advantages of the embodiments have been set forth in the foregoing description, together with details of the structure and function of the embodiments, the disclosure is illustrative only, and changes may be made in detail, especially in matters of shape, size, and arrangement of parts within the principles of the embodiments to the full extent indicated by the broad general meaning of the terms in which the appended claims are expressed.

What is claimed is:

1. A universal serial bus (USB) component tester for testing a USB component that has a plug and a USB port, the USB component tester comprising:
    a connector configured for connecting to the plug, and comprising a first power pin, a first data pin connected to the first power pin, a second data pin, and a first ground pin connected to the second data pin and also connected to the first data pin via a first resistor;
    a USB port configured for connecting to the USB port of the USB component, and comprising a power terminal connected to a power supply, a first data terminal, a second data terminal, and a grounded ground terminal, the first data terminal being connected to the second data terminal via a second resistor;
    a first indicator configured for indicating whether the USB component works in a normal work state, and comprising a first terminal connected to the first data terminal via the second resistor, and a second terminal connected to the second data terminal.

2. The USB component tester of claim 1, further comprising a third resistor and a second indicator, wherein a first terminal of the third resistor is connected to the power supply and the power terminal, a second terminal of the third resistor is connected to a first terminal of the second indicator, a second terminal of the second indicator is connected to the ground terminal and grounded.

3. The USB component tester of claim 2, wherein the third resistor is a resistor of about 200 ohms, the second indicator is a light emitting diode (LED), the first terminal of the second indicator is the anode of the LED, and the second terminal of the second indicator is the cathode of the LED.

4. The USB component tester of claim 3, wherein the second indicator is a buzzer.

5. The USB component tester of claim 1, further comprising a first diode, wherein the first diode comprises an anode connected to the first power pin of the connector, and a cathode connected to the first data pin of the connector and the second data pin and the first ground pin of the connector via the first resistor.

6. The USB component tester of claim 5, further comprising a second diode, wherein the connector further comprises a second power pin, a third data pin, a fourth data pin, and a second ground pin, the second power pin is connected to an anode of the second diode, a cathode of the second diode is connected to the third data pin of the connector and the fourth data pin and the second ground pin of the connector via a resistor.

7. The USB component tester of claim 6, wherein the resistor is a resistor of about 2000 ohms.

8. The USB component tester of claim 1, wherein the first indicator is an LED, the first terminal of the first indicator is an anode of the LED, and the second terminal of the first indicator is a cathode of the LED.

9. The USB component tester of claim 1, wherein the first indicator is a buzzer.

10. The USB component tester of claim 1, wherein the first resistor is a resistor of about 2000 ohms, and the second resistor is a resistor of about 200 ohms.

11. The USB component tester of claim 1, wherein the power supply is a 5V direct current power supply.

12. The USB component tester of claim 1, further comprising a power switch, wherein the power switch is connected between the power terminal and the power supply.

13. The USB component tester of claim 1, further comprising a case, wherein the first indicator, the USB port and the connector are installed on the case.

* * * * *